United States Patent
Van Lear et al.

(10) Patent No.: US 7,177,151 B2
(45) Date of Patent: Feb. 13, 2007

(54) COOLING DEVICES AND SYSTEMS

(75) Inventors: Brian T. Van Lear, Hastings, MN (US); Jerad D. Whitaker, Richfield, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 158 days.

(21) Appl. No.: 10/941,575

(22) Filed: Sep. 15, 2004

(65) Prior Publication Data

US 2006/0056994 A1 Mar. 16, 2006

(51) Int. Cl.
*F04B 17/00* (2006.01)
*H05K 7/20* (2006.01)

(52) U.S. Cl. .............. 361/696; 165/85; 165/104.33; 361/698; 361/699; 417/390

(58) Field of Classification Search ............. 165/85, 165/104.28, 104.33; 361/696, 697, 698, 361/701, 703, 699; 417/390
See application file for complete search history.

(56) References Cited

U.S. PATENT DOCUMENTS

| | | | | |
|---|---|---|---|---|
| 2,643,282 A | * | 6/1953 | Greene | 165/104.33 |
| 3,910,728 A | * | 10/1975 | Sloan | 417/390 |
| 3,934,644 A | * | 1/1976 | Johnston | 165/85 |
| 4,322,949 A | * | 4/1982 | Byrne et al. | 60/606 |
| 4,366,783 A | | 1/1983 | Clemente | 123/41.12 |
| 5,284,202 A | * | 2/1994 | Dickey et al. | 165/85 |
| 5,748,269 A | | 5/1998 | Harris et al. | 349/58 |
| 5,964,279 A | * | 10/1999 | Mochizuki et al. | 165/104.33 |
| 6,208,512 B1 | * | 3/2001 | Goldowsky et al. | 361/699 |
| 6,446,026 B1 | * | 9/2002 | Dean et al. | 361/695 |
| 6,493,440 B2 | | 12/2002 | Gromatzky et al. | 379/161 |
| 6,600,649 B1 | * | 7/2003 | Tsai et al. | 361/697 |

FOREIGN PATENT DOCUMENTS

FR 2640316 A3 * 6/1990

* cited by examiner

*Primary Examiner*—Michael Koczo, Jr.
(74) *Attorney, Agent, or Firm*—Brooks & Cameron, PLLC

(57) ABSTRACT

Methods, systems, and devices are provided for cooling a heat source. One apparatus embodiment includes a housing, a fluid conduit, a pump within the housing and in communication with the fluid conduit for conveying fluid through the fluid conduit, and a turbine in communication with the fluid conduit to be driven by the fluid as it passes through the fluid conduit.

22 Claims, 7 Drawing Sheets

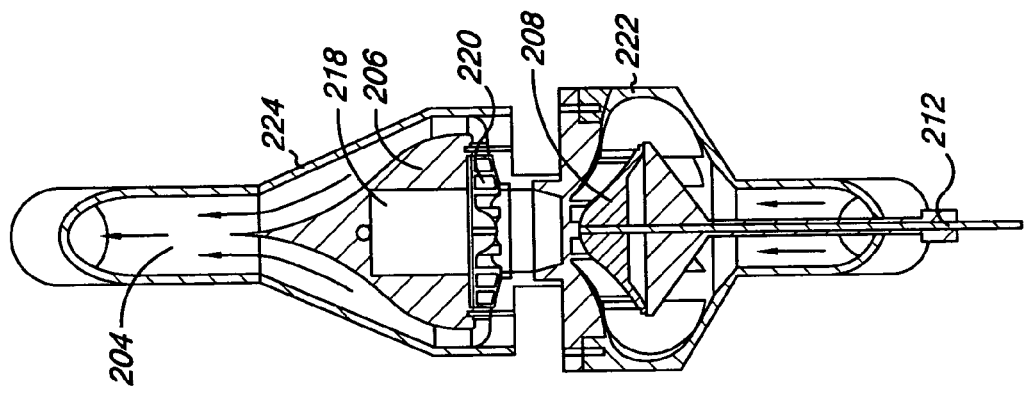
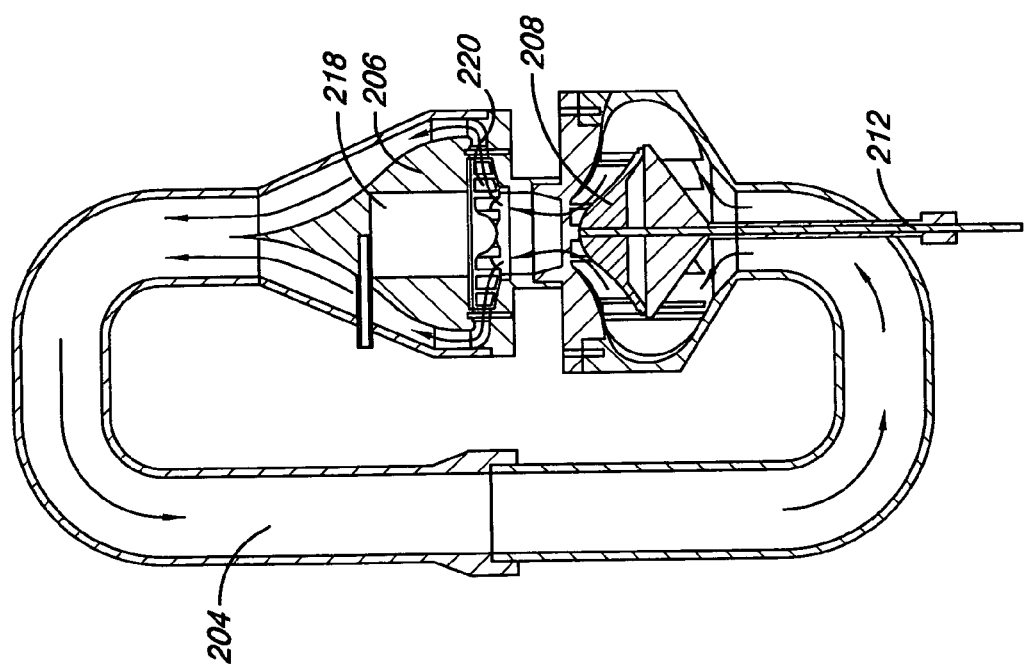

COOLING DEVICES AND SYSTEMS

FIELD OF THE INVENTION

The present invention generally relates to temperature adjustment systems, and more particularly, to a cooling system for removing heat from a heat source.

BACKGROUND

Heating and cooling systems and devices are used in many contexts. For example, electronic components, such as computing components including processor circuit boards and the like, generate heat. In some instances, too much heat can result in a drop in performance or damage to the component or to other nearby components that are sensitive to heat. In such instances, the heat generating components can be kept cool by cooling devices and systems operating in various manners.

Additionally, in some situations, components can be located within a housing. Various devices and systems use sealed and unseal housings for protecting the contents of the housing. Unsealed housings can provide for some protection from materials such as gases, fluids, dust, and debris, but since they are unsealed, the contents of the housing can still be exposed to such materials.

A sealed housing can be used to reduce the exposure of the components to the elements. However, when sealed enclosures (and unsealed enclosures, to some extent) are used to house heat generating components, the enclosure has a tendency to magnify the temperature of the components therein and the ambient air or other materials surrounding the components.

Cooling devices and systems that are often used to reduce the temperature of components typically are unitary devices that could either be positioned within the housing or outside the housing. Each of these positions has some drawbacks. For example, if the cooling device is located inside the housing, the device will use heated air from within the housing to attempt to cool the components within the housing. This is generally ineffective since, removal of heat from within the housing can only be achieved through heat transfer through the walls of the housing.

When the device is outside the housing, the device can take advantage of potentially cooler air outside the housing, but the device is isolated from the component by the housing walls. Therefore, in such instances, the device cannot directly cool the component.

SUMMARY OF THE INVENTION

The present invention is generally directed to methods, systems, and devices for cooling a heat source. More specifically, the present invention is generally directed to cooling methods, systems, and devices that use a cooling fluid to remove heat from a heat source. Such methods, devices, and systems, as disclosed herein, can be used in any instance where removal of heat from a heat source would be beneficial. One particularly desirable application of such cooling systems and devices is in cooling electronics within a vehicle, such as an air craft, marine craft, space craft, or land craft, among others.

One aspect of the invention relates to a device having a housing, a fluid conduit, a pump, and a turbine. The housing can be any suitable housing for protection of components within the housing from debris and elements of nature. For example, a housing can be used to reduce the accumulation of dust on the components or to protect the components from fluids, such as water and other fluids, that may be present. In various embodiments, the housing can be environmentally restrictive or impervious to gases, fluids, and/or solids.

Such housings can be useful, for example, when an area has to be cleaned using a fluid cleaner (e.g., water, fluid chemicals, etc.) and where some components would be damaged by exposure to the fluids. For example, electronic components can become damaged when exposed to water. In such cases, a water impervious housing can be provided to surround the components, thereby protecting them from exposure. Additionally, the pump can be provided within the housing. This can be advantageous if the pump is an electrically powered pump, thereby being capable of damage from exposure to water, other fluids, and dust, for example.

Further, in some embodiments, the housing can be restrictive or impervious to particular types of gases, fluids, and/or solids. For example, in some instances, restriction of nuclear, biological, and/or chemical materials, and/or electromagnetic energy may be beneficial. In such instances, a housing can be formed from a material that can be restrictive or impermeable to such materials.

The housing can include a heat source located therein or adjacent thereto. When a heat source is positioned proximate to the fluid conduit, heat from the heat source can be transferred to the fluid in the fluid conduit. When the heat source is positioned outside the housing, if placed proximate to a wall of the housing, the wall can be used to draw heat from the heat source and transfer the heat to the fluid conduit.

The heat source can include a number of heat generating components, such as a number of processors, circuit boards, transistors, capacitors, batteries, and/or motors. The fluid conduit can be positioned to pass in proximity to each of the components within the heat source. A heat sink can also be a heat source. The heat sink can be used to draw heat away from a number of components and the fluid conduit can pass in proximity to the heat sink in order to draw heat from the heat sink. Additionally, in some embodiments, the fluid conduit can pass through the heat source. For example, where the heat source includes an enclosed space, the fluid conduit can pass through the enclosed space.

The pump can be positioned in communication with the fluid conduit for conveying fluid through the fluid conduit in order to move the fluid from a proximity near the heat source to a position away from the heat source where the heat can be removed from the fluid. For example, in various embodiments, the device or system can move the fluid to within proximity of a heat exchanger. The heat exchanger can then be used to extract the heat from the fluid. In various embodiments, the heat exchanger can be located outside housing to aid in the removal of heat by using air from outside of the housing for cooling the heat exchanger.

The turbine can be positioned in communication with the fluid conduit to be driven by the fluid as the fluid passes through the fluid conduit. The turbine can be attached to a shaft for driving a fan. In such embodiments, the fan can circulate the ambient air around the heat exchanger in order to aid in the cooling of the fluid passing through the fluid conduit. In this way, the fan can be used to dissipate heat from the fluid in the fluid conduit. For example, the fan can pull ambient air away from the heat exchanger or push air toward the heat exchanger in order to circulate the air around the heat exchanger.

Various refinements exist of the features noted in relation to the subject first aspect of the present invention as well.

Further features may also be incorporated in the various aspects of the present invention as well. These refinements and additional features may exist individually or in any combination.

Herein, reference to a "heat source" generally refers to any item that produces heat. For example, computer components, such as processors, can be considered heat sources. Additionally, electronic components can generally be considered heat sources. Further, a heat source can include a number of components, such as computer processors and/or circuit boards, for example and such components can be disbursed with respect to each other.

In various embodiments of the invention, the impeller does not have to be protected by the housing and, accordingly, the impeller can be positioned outside the housing. In this way, the impeller can be accessible for service or replacement without having to access the housing. Such embodiments can also allow for the housing to be smaller which can, for example, save cost in materials used to form the housing.

As discussed above, the housing, in some embodiments of the first aspect of the present invention, can be an environmentally restrictive housing. For example, the housing can reduce the passage of or be impervious to electromagnetic energy, fluids, gases, and/or solids. Such materials can include nuclear, biological, and chemical materials, among others. In such embodiments, the housing can, for instance, be sealed such that the housing is impervious to one or more fluids, such as water, fluids containing nuclear, chemical, and/or biological material, and the like.

Embodiments of the invention can also have a housing that is sealed such that the housing is impervious to one or more gases, such as air, for example. The housing can be formed from a single piece of material or from two or more pieces and can utilize gaskets between the housing portions in order to restrict passage of electromagnetic energy, fluids, gases, and/or solids.

Such embodiments allow the exterior components around the housing to be cleaned without affecting the interior components. For example, if all electrical components are positioned within the housing and the housing is impervious to fluids, then a fluid, such as water, can be used to clean the area around the housing without affecting the interior contents.

In some embodiments, the heat source and the pump can be provided within the housing while the turbine and heat exchanger are positioned outside the housing. In his way, the turbine and heat exchanger can be cleaned and maintained without affecting the heat source and pump.

In various embodiments of the invention, a heat exchanger can be used in the system or device. Herein, reference to a "heat exchanger" generally refers to any item that extracts heat from a fluid source. For example, heat exchangers can include a wall of the housing or an apparatus designed to function as a heat exchanger. Heat exchangers can include fins to increase the surface area of the apparatus thereby increasing the surface area available to dissipate heat into the ambient air surrounding the heat exchanger.

In various embodiments of the invention, the heat exchanger can be positioned outside the housing. In this way, the heat can be readily passed to the exterior of the housing for dissipation to the ambient air surrounding the housing. In some embodiments of the invention, the fluid conduit can be positioned to direct fluid through the heat exchanger.

BRIEF DESCRIPTION OF THE DRAWINGS

FIG. 2B is a cutaway overhead view of the embodiment of FIG. 2A taken along line 2B—2B.

FIG. 2C is a cutaway side view of the embodiment of FIG. 2A taken along line 2C—2C.

DETAILED DESCRIPTION

Embodiments of the present invention include methods, systems, and devices for cooling a heat source. Embodiments of the present invention will now be described in relation to the accompanying drawings, which will at least assist in illustrating the various features of the various embodiments.

Figure 1:
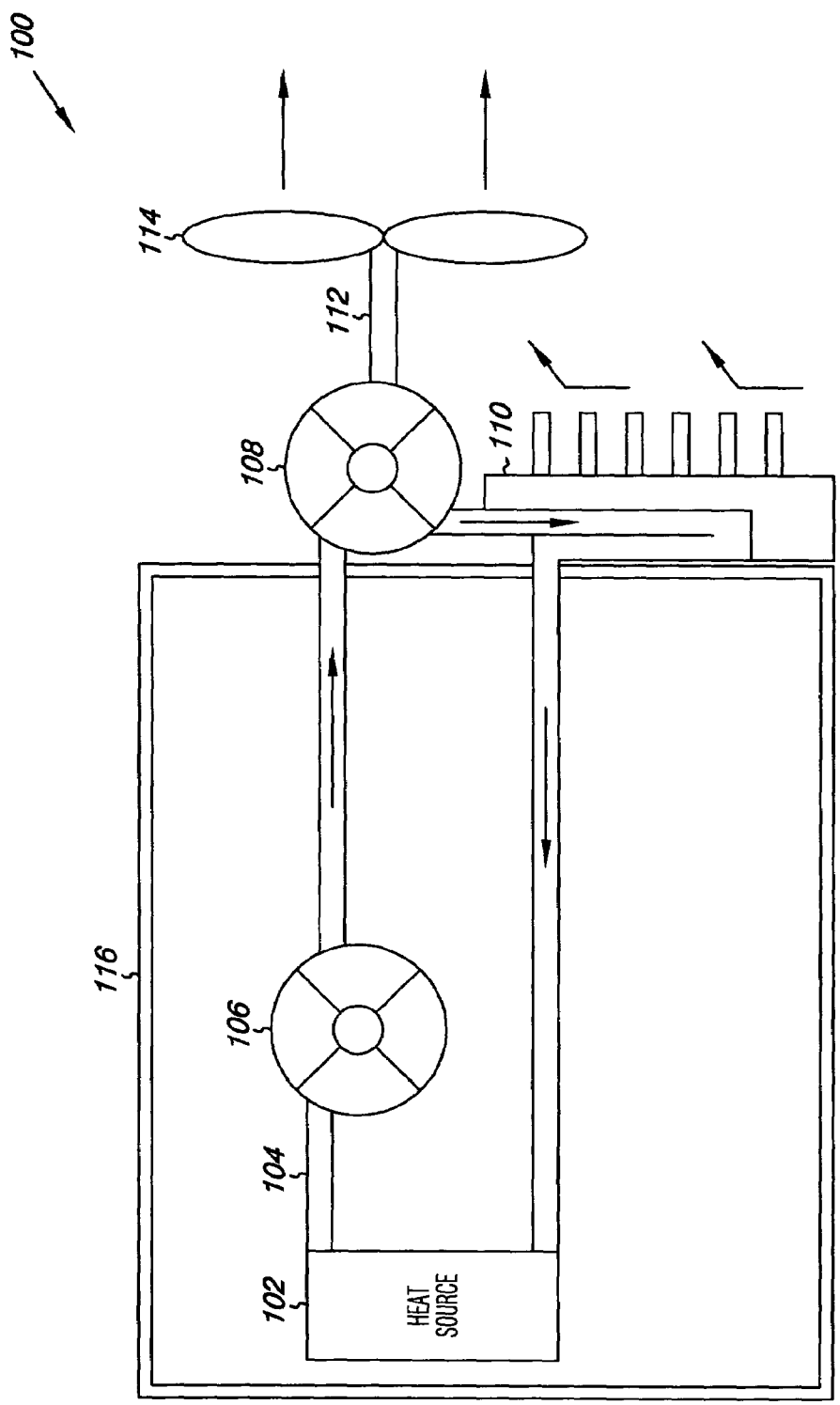
FIG. 1 is a schematic of an embodiment of a cooling system.

FIG. 1 is a schematic of an embodiment of a cooling device or system. In various embodiments, the device or system 100 can include at least a portion that is environmentally restrictive, as described in more detail below.

The embodiment shown in FIG. 1 includes a heat source 102, a fluid conduit 104, and a heat exchanger 110. In the embodiment shown in FIG. 1, the heat source 102 is located within a housing 116. In various embodiments, the housing 116 can be an environmentally restrictive housing, thereby reducing the amount of electromagnetic energy, gas, fluid, and/or debris that can enter the housing 116.

In some embodiments, the housing 116 can be impervious to electromagnetic energy, gas, fluid, and/or debris. In this way, the housing 116 can be used to protect, in some cases completely, the contents of the housing 116 from such materials, while allowing the cooling system or device 100 to utilize air outside the housing 116 in its cooling process.

Further, if a housing is provided that is restrictive to nuclear, biological, and chemical (NBC) materials, it may be possible to provide internal contents thereto that are not NBC rated. Since NBC rated components can be more expensive than components that are not NBC rated, such a system or device can be more cost effective.

Additionally, the restrictive nature of the housing 116 also allows the contents of the housing 116 to remain relatively clean and can allow the exterior of the housing 116 to be cleaned with a gas or fluid. Such embodiments are particularly advantageous when used with electronic components. For example, in various embodiments, a heat source 102, such as a computer processor or circuit board, can be positioned within the housing 116, while non-electrical components are positioned outside the housing 116.

In such embodiments, material such as dust, debris, fluids, and/or gases are allowed to contact the components outside the housing and the components located outside are capable of being cleaned. The restrictive nature of the housing 116 allows the components therein to remain relatively clean, while a cooling system or device as disclosed herein can be used to cool the contents of the housing 116.

Embodiments of the present invention also include a heat exchanger 110. The heat exchanger acts to dissipate heat out of the fluid conduit 104. Heat exchangers 110 can come in various types. For example, heat exchangers can be a wall of the housing 116 or can be separate devices that are designed for the removal of heat from a gas or fluid. In the embodiment shown in FIG. 1, the heat exchanger 110 is a device having a number of fins thereon which act to increase the surface area of the device that is exposed to the ambient air surrounding the device. In this way, more heat can be transferred from the fluid to the air surrounding the device.

The fluid within the fluid conduit 104 is moved through the conduit 104 with the aid of a pump 106. Various types of pumps can be used with respect to the various embodiments of the invention. For example, in environmentally restrictive embodiments, the pump 106 can be an electric or hydraulic pump. Additionally, various types of fluid can be used in the embodiments of the present invention. For example, water, antifreeze, and other fluids can be used in the embodiments discussed herein.

In the embodiment shown in FIG. 1, the fluid conduit 104 passes through the housing to a heat exchanger 110 positioned outside the housing 116. The embodiments of the present invention are not so limited however, and in some embodiments, the fluid conduit 104 can reside within the housing 116 and the heat can be exchanged through one of the walls of the housing 116.

Various embodiments of the present invention also include a turbine 108 that is in fluid communication with the fluid conduit 104. The turbine 108 can be used to drive a fan 114. As shown in the embodiment of FIG. 1, a shaft 112 can be attached to the turbine 108. The fluid's interaction with the turbine 108 as it moves past the turbine 108 can thereby be used to turn the shaft 112 which turns the blades of the fan 114.

The fan 114 can be positioned such that it circulates air around the heat exchanger 110. In this way, the heat exchanger 110 can provide additional cooling since the air, into which the heat is transferred, is moved away from the heat exchanger 110. As shown in FIG. 1, the air can be moved by drawing the air proximate to the heat exchanger 110 away from the heat exchanger 110. Additionally, in various embodiments, air can be pushed toward the heat exchanger 110 to circulate the air proximate to the heat exchanger 110.

Figure 2A:
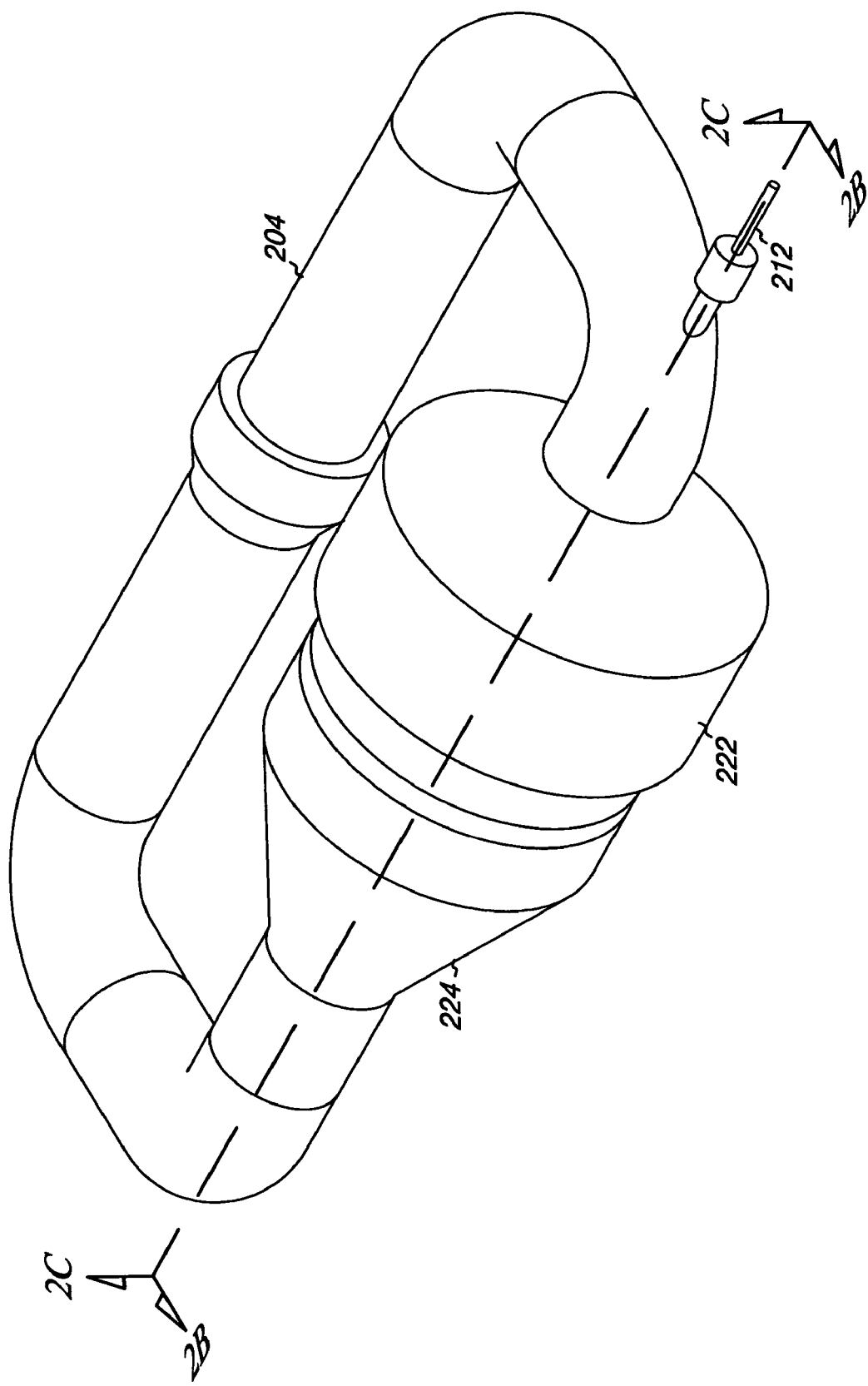
FIG. 2A is an isometric view of an embodiment of a cooling system.

FIG. 2A is an isometric view of an embodiment of a cooling system. FIG. 2B is a cutaway overhead view of the embodiment of FIG. 2A taken along line 2B—2B. FIG. 2C is a cutaway side view of the embodiment of FIG. 2A taken along line 2C—2C.

The embodiment of FIGS. 2A–2C includes a fluid flow conduit 204, a pump 206, and a turbine impeller 208. The pump 206 moves the fluid within the conduit 204 and past the turbine impeller 208 which is driven by the moving fluid. The pump includes a motor 218 and a number of blades 220 to direct the fluid through the conduit 204.

In this embodiment, the pump 206 pulls the fluid through the cavity housing the turbine impeller 208, thereby driving the turbine impeller 208, however, the embodiments of the invention are not limited to pulling or drawing the fluid. For example, in some embodiments, the pump 206 can be arranged to push fluid toward the turbine impeller 208.

Further, in some embodiments, the pump can be positioned close to the turbine. This proximity can provide an added benefit when turning the shaft 212. For example, in the embodiment shown in FIGS. 2A–2C, the proximity of the pump 206 to the turbine impeller 208 can create extra motive force on the turbine impeller 208 since the fluid is being drawn from such a close distance to the turbine impeller 208.

Although not shown in FIGS. 2A–2C, the embodiments of the invention can include a heat source and a heat exchanger proximate to the fluid conduit 204, as shown in FIG. 1. In various embodiments, a number of heat sources can be present along the fluid conduit 204. Additionally, although the fluid conduit is shown in FIGS. 2A–2C as being formed of two portions joined together, the fluid conduit can be formed as a single portion, or from more than two portions.

Depending upon its intended environment, the fluid conduit 204, the housings for the pump 224 and turbine housing 222, turbine impeller 208, and pump 206 can be manufactured from a variety of suitable materials. For example, polymers and metals are two such suitable materials. A material such as aluminum provides a number of benefits to the embodiments of the present invention. For instance, aluminum is a good heat conductor and can provide a shield to electromagnetic energy, and many fluids, gases, and solids. Additionally, gaskets can be used to seal areas where the fluid conduit 204 passes through the housing. Gaskets can be of various suitable materials including, but not limited to polymers and rubbers, for example.

Additionally, the path of the fluid conduit 204 can be in any suitable shape. For example, the shape shown in FIGS. 2A–2C is an oval, but the shape shown in FIGS. 3A–3C is an irregular shape.

Additionally, although in FIGS. 2A–2C, a system or device housing is not shown, a housing can be provided to shield a portion of the device or system from electromagnetic energy, fluids, gases, and/or solid materials. For instance, a wall of a housing can be positioned between the pump housing 224 and the turbine housing 222, thereby isolating the pump and the turbine from each other.

The pump housing 224 and/or the turbine housing 222 can also provide shielding from materials. In some embodiments, the pump housing 224 and/or the turbine housing 222 can be combined with a system or device housing that also provides shielding from electromagnetic energy, fluids, gases, and/or solid materials.

Figure 3A:
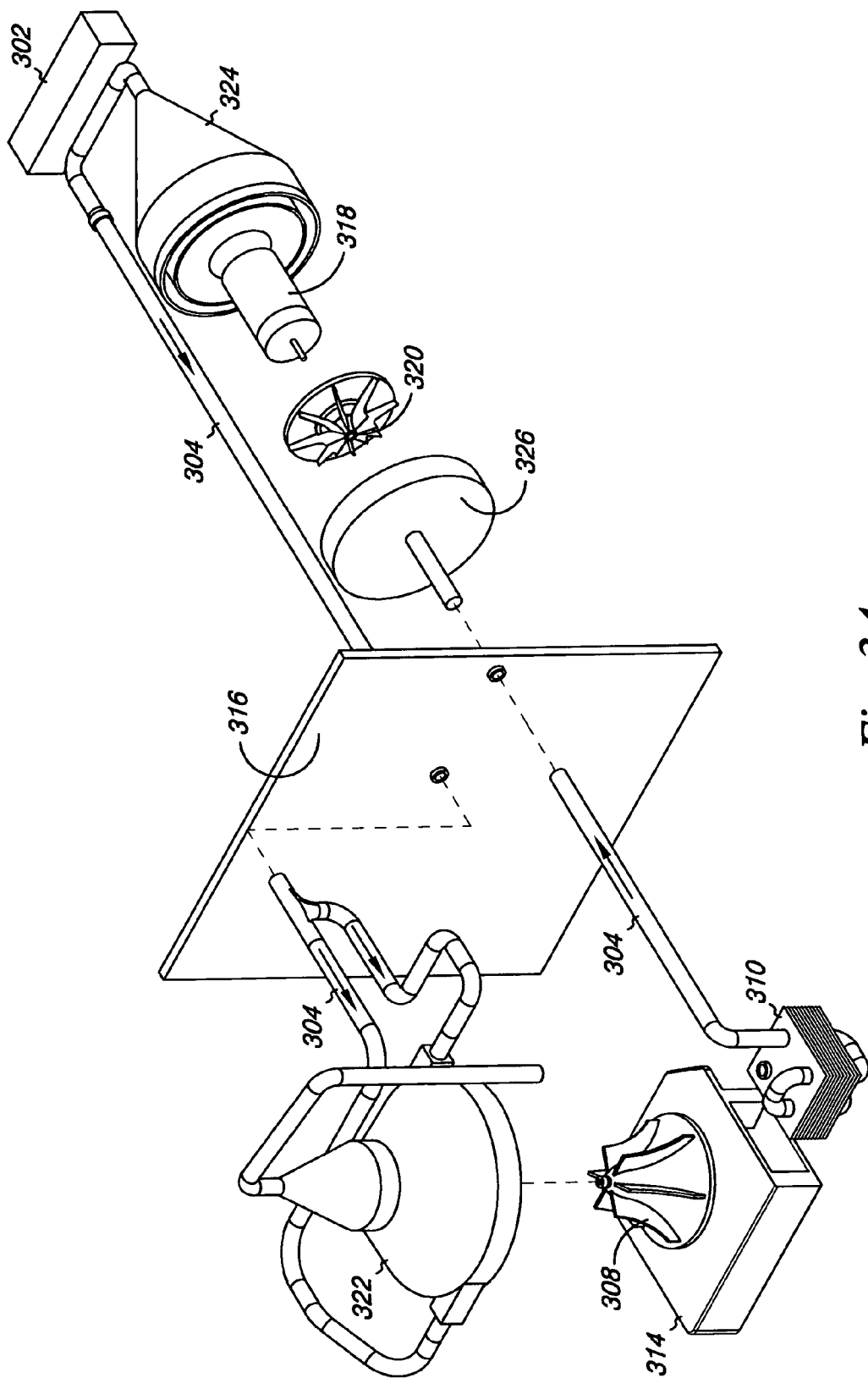
FIG. 3A is an exploded isometric view of another embodiment of a cooling system.
Figure 3B:
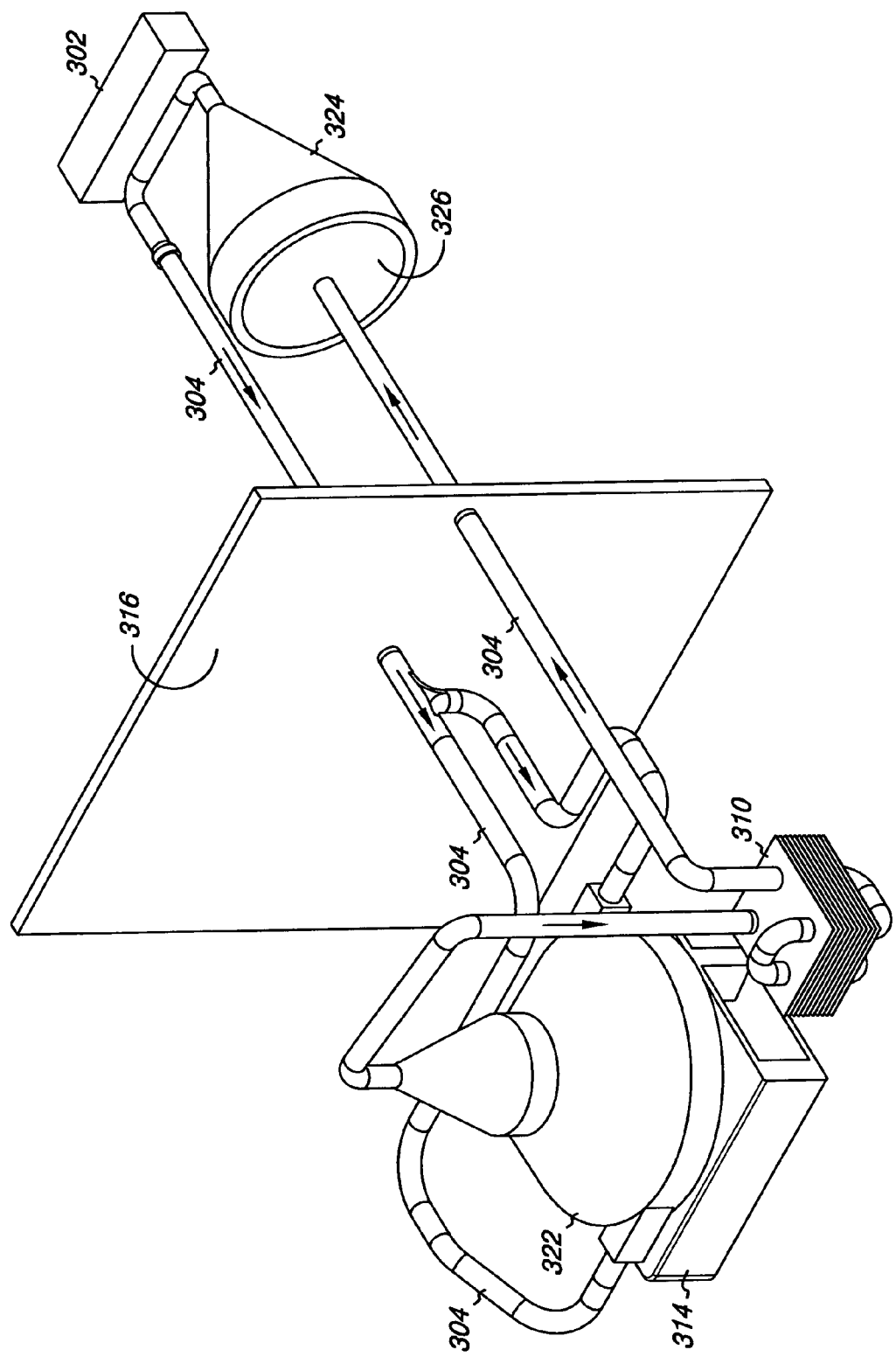
FIG. 3B is an isometric view of the embodiment of FIG. 3A.
Figure 3C:
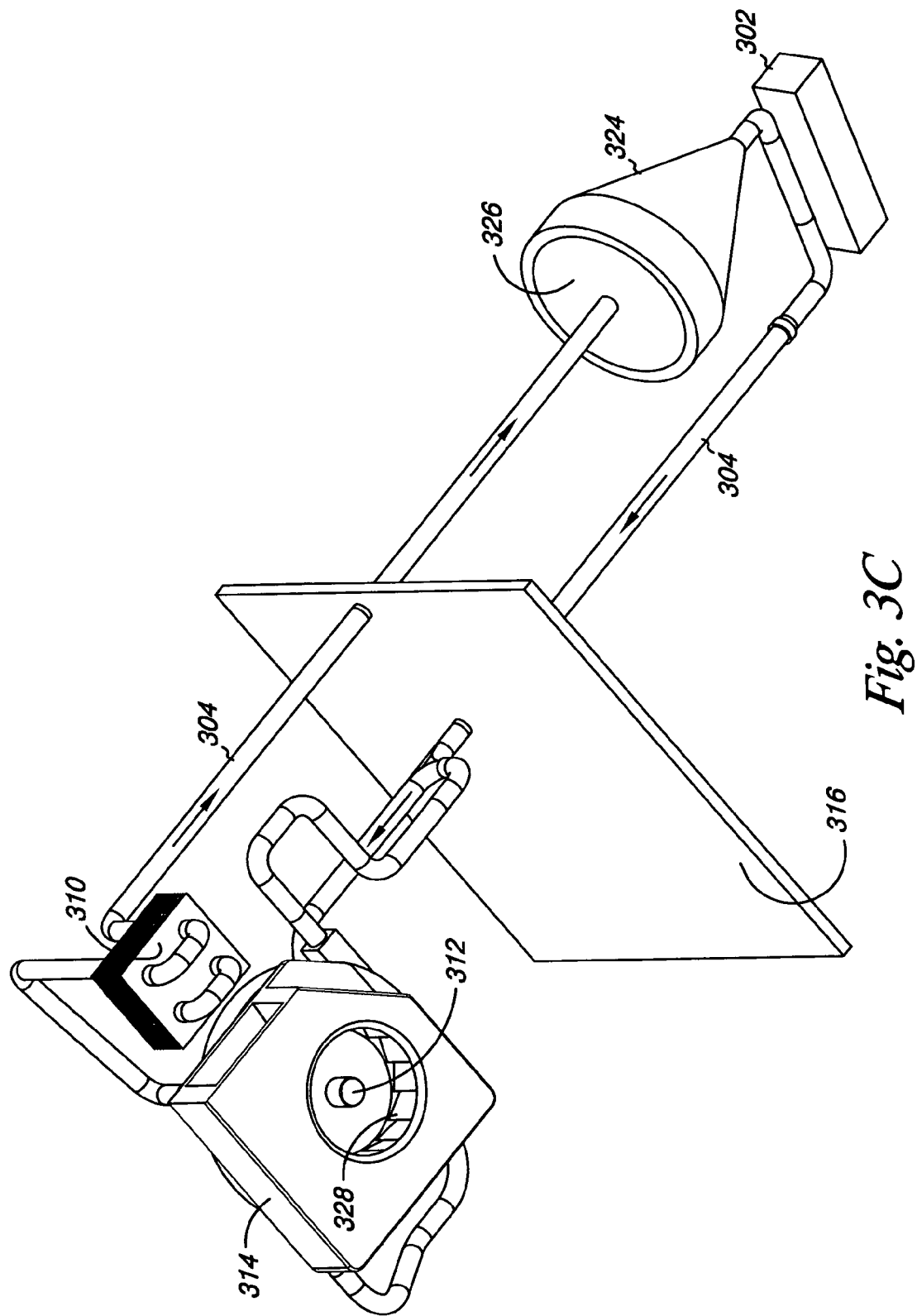
FIG. 3C is a bottom isometric view of the embodiment of FIG. 3A.

FIG. 3A is an exploded isometric view of another embodiment of a cooling system. The embodiment of FIG. 3 illustrates the wall of a housing 316 that separates the turbine and heat exchanger on the left side of the wall 316 from the pump and heat source 302 on the right side of the wall 316.

On the left side of the wall 316, the system includes a pump having a turbine impeller 308, a turbine housing 322, and a fan housing 314 having a fan (designated in FIG. 3C as 328) provided therein. A shaft (designated in FIG. 3C as 312) connects the fan 328 within fan housing 314 with the turbine impeller 308. A heat exchanger 310 is also provided for dissipating heat from the fluid conduit 304.

On the right side of the wall 316, the fluid flow conduit 304 is positioned in proximity to the heat source 302. The right side also includes a pump housing 324, a pump motor 318, a pump impeller 320, and a pump housing cover 326. Those of ordinary skill in the art will appreciate from reading the present disclosure that different types of pump can be used in embodiments of the present invention including those having centrifugal and non-centrifugal blade configurations. The pump example provided in FIG. 3A, for instance is a centrifugal pump design having a pump impeller 320 having a number of impeller blades.

FIG. 3B is an isometric view of the embodiment of FIG. 3A. The illustration of FIG. 3B shows an assembled illustration of the exploded embodiment of FIG. 3A. In this embodiment, the turbine housing 322 is mounted such that the turbine impeller 308 is housed with the turbine housing 322. Fluid is directed into the turbine housing 322 through portions of the fluid conduit 304. The fluid enters the turbine housing 322 and is directed therethrough and into another portion of fluid conduit 304. As the fluid passes through the turbine housing 322, the fluid drives the movement of the turbine impeller 308, which is attached by a shaft to the fan within fan housing 314.

Once the fluid exits the turbine housing 322, the fluid is directed through the fluid conduit 304 and into the heat exchanger 310. As stated above, the heat exchanger 310 can be of any suitable variety. For example, the heat exchanger shown in FIGS. 3A–3C is a fin type heat exchanger having fins on the exterior of the exchanger to aid in the dissipation of heat from the fluid. In the embodiment shown in FIGS. 3A–3C, the fan housing 314 directs the air movement of the fan out the side of the fan housing 314. Accordingly, the heat exchanger 310 is positioned in the path of the air directed out of the fan housing 314.

Once the fluid has passed through the heat exchanger 310, the fluid is directed into another portion of the fluid conduit 304 and through the wall 316 of the housing. Once inside the housing, the fluid is directed into the pump housing 324. In the embodiment shown, the fluid is directed into the pump housing through the pump housing cover 326. Depending upon the type of pump used, the fluid can be pushed, drawn, or a combination of these forces can be used to direct the fluid into the pump housing 324. The fluid is passed through the pump housing 324 and into another portion of fluid conduit 304.

The fluid is then directed past the heat source 302 where heat is absorbed into the fluid from the heat source 302. In this way, heat is removed from the heat source 302. The fluid continues down the fluid conduit 304 and through wall 316 where it is again directed into the impeller housing 322 and the process is begun again. Through this process, the heat from the heat source 302 can be transferred out of the housing 316. Further, the movement of the fluid can also be used to drive a fan (e.g., fan 328) or other mechanism to aid in the cooling and/or dissipation of the heat from the heat exchanger 310.

FIG. 3C is a bottom isometric view of the embodiment of FIG. 3B. In this view, the intake of the fan housing 314 and the fan itself 328 are shown. In the embodiment of FIG. 3C, the fan 328 is driven by a shaft 312 which is attached to the turbine impeller 308 and driven by the movement of fluid therethrough. Those of ordinary skill in the art will appreciate from reading this disclosure that any suitable type of fan can be used in the embodiments of the present invention. For example, centrifugal and non-centrifugal fan types can be used in the various embodiments disclosed herein.

As stated above, the heat exchanger 310 can be positioned as shown in FIG. 3C, such that the fan 328 directs air toward the heat exchanger 310. In some embodiments, the heat exchanger can be positioned such that the intake of the fan housing 314 draws air away from the heat exchanger 310 and into the intake of the fan housing 314.

Figure 4:
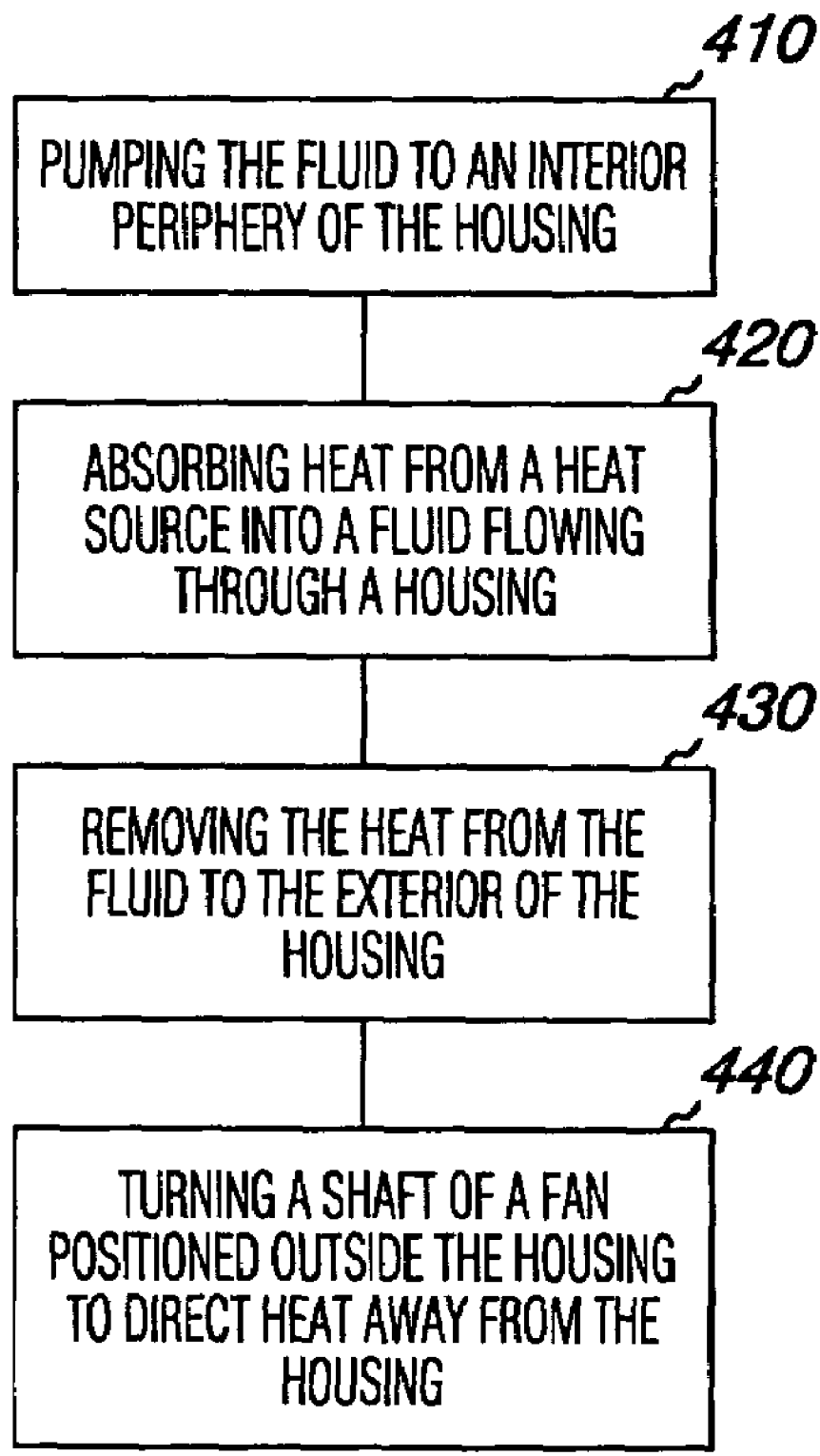
FIG. 4 illustrates a method embodiment for cooling a heat source.

FIG. 4 illustrates a method embodiment for cooling a heat source. Unless explicitly stated, the method embodiments described herein are not constrained to a particular order or sequence. Additionally, some of the described method embodiments or elements thereof can occur or be performed at the same point in time.

The method embodiment of FIG. 4 includes pumping a fluid to an interior periphery of a housing at block 410. The method embodiment also includes absorbing heat from a heat source into the fluid flowing through the housing at block 420, as the same has been described above. Absorbing heat from a heat source into a fluid flowing through a housing can be achieved, for instance by absorbing heat from a heat source within a housing. Additionally, absorbing heat from a heat source can include absorbing heat from an electrical component, such as a component within or outside of the housing.

For components outside the housing, a heat transfer mechanism can be used to transfer the heat to the fluid. For example, the electrical component can be positioned adjacent a heat sink or wall of the housing the heat can be transferred to the heat sink or wall. In such embodiments the fluid conduit can be positioned proximate to the heat sink or wall or positioned to pass through the heat sink or wall, for example. In this manner, the heat can be absorbed by the fluid.

The method embodiment shown in FIG. 4 also includes removing the heat from the fluid to the exterior of the housing at block 430. Removing the heat can, for example, include directing the fluid into a heat exchanger.

At block 440, the method embodiment also includes turning a shaft of a fan positioned outside the housing to direct heat away from the housing. In various embodiments turning a shaft of a fan can include moving an impeller by directing the fluid through the impeller connected to the shaft of the fan.

Although specific embodiments have been illustrated and described herein, those of ordinary skill in the art will appreciate that any arrangement calculated to achieve the same techniques can be substituted for the specific embodiments shown. This disclosure is intended to cover adaptations or variations of various embodiments of the invention. It is to be understood that the above description has been made in an illustrative fashion, and not a restrictive one.

Combination of the above embodiments, and other embodiments not specifically described herein will be apparent to those of skill in the art upon reviewing the above description. The scope of the various embodiments of the invention includes various other applications in which the above structures and methods are used. Therefore, the scope of various embodiments of the invention should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the embodiments of the invention require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a housing;
a fluid conduit;
a pump within the housing and in communication with the fluid conduit for conveying fluid through the fluid conduit; and
a turbine in communication with the fluid conduit to be driven by the fluid as it passes through the fluid conduit and attached to a shaft that provides rotation to a fan blade to move air away from the housing.

2. The apparatus of claim 1, wherein the housing includes a heat source and wherein heat from the heat source can be absorbed by the fluid in the fluid conduit.

3. The apparatus of claim 2, wherein the heat source includes a number of computer processors.

4. The apparatus of claim 2, wherein the heat source includes a number of circuit boards.

5. The apparatus of claim 1, wherein the turbine is positioned outside the housing.

6. The apparatus of claim 1, wherein the turbine impeller is connected to a drive shaft that is driven by communication of the turbine impeller with the fluid passing through the fluid conduit.

7. The apparatus of claim 6, wherein the drive shaft drives a fan to dissipate heat from the fluid in the fluid conduit.

8. The apparatus of claim 1, wherein the housing is nuclear, biological, and chemical restrictive.

9. The apparatus of claim 1, wherein the apparatus further includes a heat exchanger for removing heat from the fluid within the fluid conduit.

10. A fluid handling system, comprising:
   a housing;
   a fluid conduit;
   a pump within the housing and in communication with the fluid conduit for conveying fluid through the fluid conduit;
   a heat exchanger for removing heat from the fluid within the fluid conduit; and
   a turbine in communication with the fluid conduit to be driven by the fluid as it passes through the fluid conduit and attached to a shaft that provides rotation to a fan blade to move air away from the housing.

11. The system of claim 10, the heat exchanger is positioned outside the housing.

12. The system of claim 10, wherein the heat exchanger includes a number of fins for dissipating heat.

13. The system of claim 10, wherein the turbine is positioned outside the housing.

14. The system of claim 10, wherein the fan blade is positioned to move air across the heat exchanger.

15. The system of claim 10, wherein the system further includes an electrical heat source positioned within the housings, wherein the pump is an electrical pump, and wherein the housing is impervious to a fluid.

16. The system of claim 10, wherein components of the system positioned outside the housing can be cleaned with a fluid.

17. The system of claim 10, wherein components of the system positioned outside the housing are non-electrical.

18. A method for cooling a heat source, comprising:
   pumping a fluid through an interior periphery of a housing;
   absorbing heat from a heat source into the fluid flowing through the housing;
   removing the heat from the fluid to an exterior of the housing with a heat exchanger; and
   directing the fluid through a turbine connected to a shaft of a fan to turn the shaft of the fan positioned outside the housing to direct heat away from the housing.

19. The method of claim 18, wherein turning a shaft of a fan includes moving a turbine impeller by directing the fluid through the turbine impeller connected to the shaft of the fan.

20. The method of claim 18, wherein removing the heat includes directing the fluid into a heat exchanger.

21. The method of claim 18, wherein absorbing heat from a heat source into a fluid flowing through a housing includes absorbing heat from a heat source within a housing.

22. The method of claim 18, wherein absorbing heat from a heat source includes absorbing heat from an electrical component.

* * * * *